United States Patent
Liao

(10) Patent No.: US 6,233,156 B1
(45) Date of Patent: May 15, 2001

(54) CIRCUIT BOARD RETAINER

(75) Inventor: Nien Chiang Liao, Lu-Chou (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/437,685

(22) Filed: Nov. 10, 1999

(30) Foreign Application Priority Data

Apr. 16, 1999 (TW) .............................................. 88 205 883

(51) Int. Cl.⁷ ........................................................ H05K 5/00
(52) U.S. Cl. .............................. 361/759; 361/801; 24/563
(58) Field of Search .................................... 361/759, 610, 361/615, 725, 726, 732, 801, 825, 758, 807; 174/138 G, 295; 24/563

(56) References Cited

U.S. PATENT DOCUMENTS

| | | | |
|---|---|---|---|
| 4,459,344 | * | 7/1984 | St. Louis ................................. 24/297 |
| 4,703,396 | * | 10/1987 | Fletcher ................................. 361/419 |
| 5,591,048 | * | 1/1997 | Hahn ..................................... 439/567 |
| 6,028,771 | * | 2/2000 | Wong et al. ........................... 361/704 |

* cited by examiner

Primary Examiner—Jeffrey Gaffin
Assistant Examiner—Hung S. Bui
(74) Attorney, Agent, or Firm—Wei Te Chung

(57) ABSTRACT

A circuit board retainer includes a U-shaped body portion having a base plate and two side plates extending from the base plate. A panel connecting portion includes first and second retaining tabs offset and extending from the base plate in opposite directions. The first retaining tab includes an upward inclined central section and two side sections. The second retaining tab has a downward inclined free edge section. The retaining tabs are received in corresponding openings defined in the support panel with the aid of the inclined free edge section of the second retaining tab. The inclined section of the first retaining tab abuts against an edge of the corresponding opening while the side sections thereof overlappingly engage underside of the support panel thereby securing the circuit board retainer to the support panel. A board connecting portion includes two resilient L-shaped members respectively extending from the side plates of the U-shaped body portion. Wedge-shaped barbs are formed on opposite edges of the L-shaped members and are inclined with respect thereto. The L-shaped members are forcibly inserted into a slot defined in a circuit board with an edge of the slot interposed between the barbs and bases of the L-shaped members thereby securely retaining the circuit board on the circuit board retainer.

12 Claims, 7 Drawing Sheets

CIRCUIT BOARD RETAINER

BACKGROUND OF THE INVENTION

1. Field of the Invention

The present invention generally relates to a device for retaining a circuit board, such as a computer main board, on a support panel, and in particular to a circuit board retainer allowing quick and ready mounting of the circuit board to the support panel.

2. The Prior Art

Personal computers comprise a main board fixed inside an enclosure. A support panel is used to support and fix the main board in the enclosure. The most straightforward manner to fix the main board to the support panel is bolts. Fixing a circuit board to a support panel by bolts, however, is a laborious and time-consuming process for many bolts are needed to effectively secure the main board on the support panel.

Taiwan Patent Application No. 82208473 and US Pat. No. 5,671,124 disclose a retainer for retaining a main board in an enclosure. A bolt is still required for securing the main board to the retainer. Taiwan Patent Application No. 84211189 discloses a retainer for retaining a circuit board in an enclosure. An L-shaped projection is formed on the retainer for engaging and securing a circuit board. The L-shaped projection, however, is not capable to soundly fix the circuit board causing poor or ineffective grounding of the circuit board.

Another example of a circuit board retainer is disclosed in Taiwan Patent Application No. 81212404 and U.S. Pat. No. 5,267,125. FIG. 7 of the attached drawings shows a circuit board retainer 99 disclosed in these patents for retaining a circuit board 130 on a support panel 150. The circuit board retainer 99 comprises a base plate 140 and two side plates 100, 120 extending from the base plate 140. An offset section 151 is formed on the support panel 150 defining a groove therebetween for slidably receiving side projections of the base plate 140 thereby retaining the retainer on the support panel 150. The side plates 100, 120 are spaced from each other and are made resilient for allowing the side plates 100, 120 to be inserted into a corresponding hole 131 defined in the circuit board 130. Notches 101, 121 are defined in opposite edges of each side plate 100, 120 whereby when the side plates 100, 120 are inserted into the hole 131, the resiliency thereof forces the notches 101, 121 to engage with a circumferential edge of the hole 131 thereby securing the circuit board 130 to the retainer 99.

In actual operation, to insert the side plates 100, 120 into the hole 131 requires manually compressing the side plates 100, 120. It would be a difficult job for a user to simultaneously handle three or more such retainers in mounting the circuit board to the retainers.

It is thus desired to provide a circuit board retainer for securing a circuit board to a support panel that overcomes the above problems.

SUMMARY OF THE INVENTION

Accordingly, an object of the present invention is to provide a circuit board retainer for retaining a circuit board on a support panel without using bolts.

Another object of the present invention is to provide a circuit board retainer having a simple structure.

A further object of the present invention is to provide a circuit board retainer for readily mounting a circuit board to a support panel.

To achieve the above objects, other than the copending application with an unknown serial number filed on Oct. 27, 1999 having the same inventor and the same assignee with the invention, a circuit board retainer in accordance with the present invention comprises a U-shaped body portion having a base plate and two side plates extending from the base plate. A panel connecting portion includes first and second retaining tabs offset and extending from the base plate in opposite directions. The first retaining tab includes an upward inclined central section and two side sections. The second retaining tab has a downward inclined free edge section. The retaining tabs are received in corresponding openings defined in the support panel with the aid of the inclined free edge section of the second retaining tab. The inclined section of the first retaining tab abuts against an edge of the corresponding opening while the side sections thereof overlappingly engage underside of the support panel thereby securing the circuit board retainer to the support panel. A board connecting portion includes two resilient L-shaped members respectively extending from the side plates of the U-shaped body portion. Wedge-shaped barbs are formed on opposite edges of the L-shaped members and are inclined with respect thereto. The L-shaped members are forcibly inserted into a slot defined in a circuit board with an edge of the slot interposed between the barbs and bases of the L-shaped members thereby securely retaining the circuit board on the circuit board retainer.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
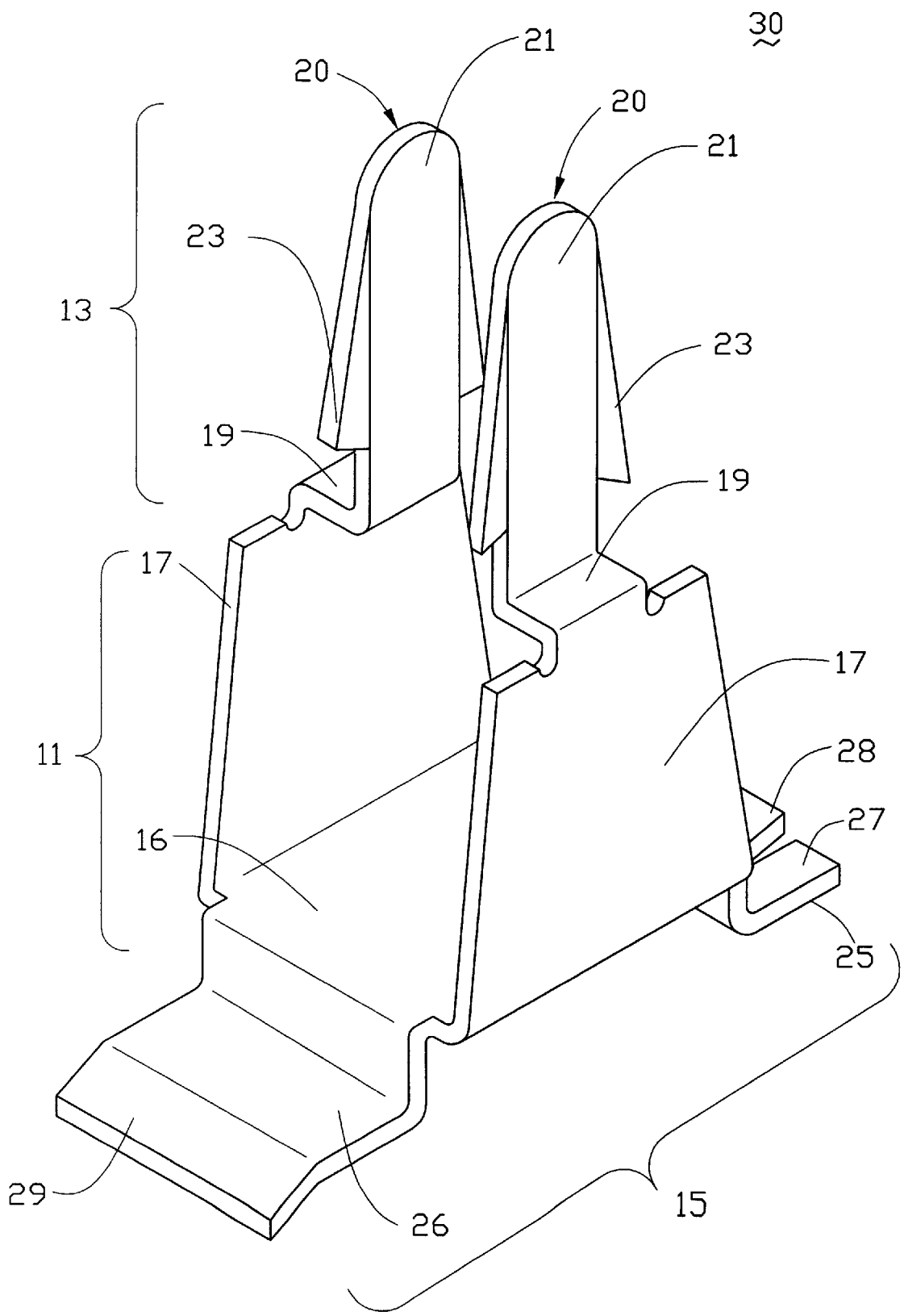
FIG. 1 is a perspective view of a circuit board retainer constructed in accordance with the present invention.
Figure 2:
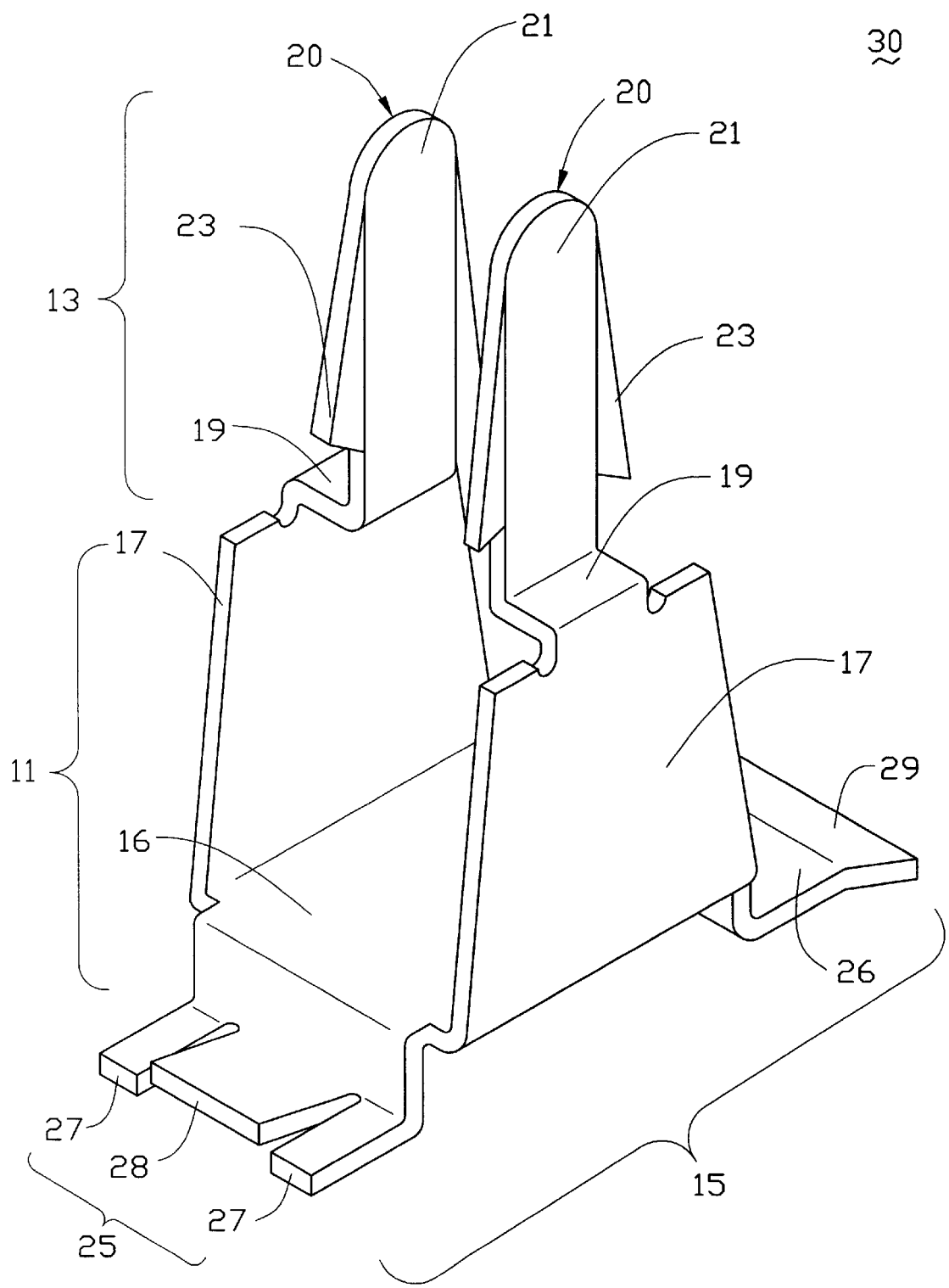
FIG. 2 is another perspective view of the circuit board retainer of the present invention.
Figures 3, 3A:
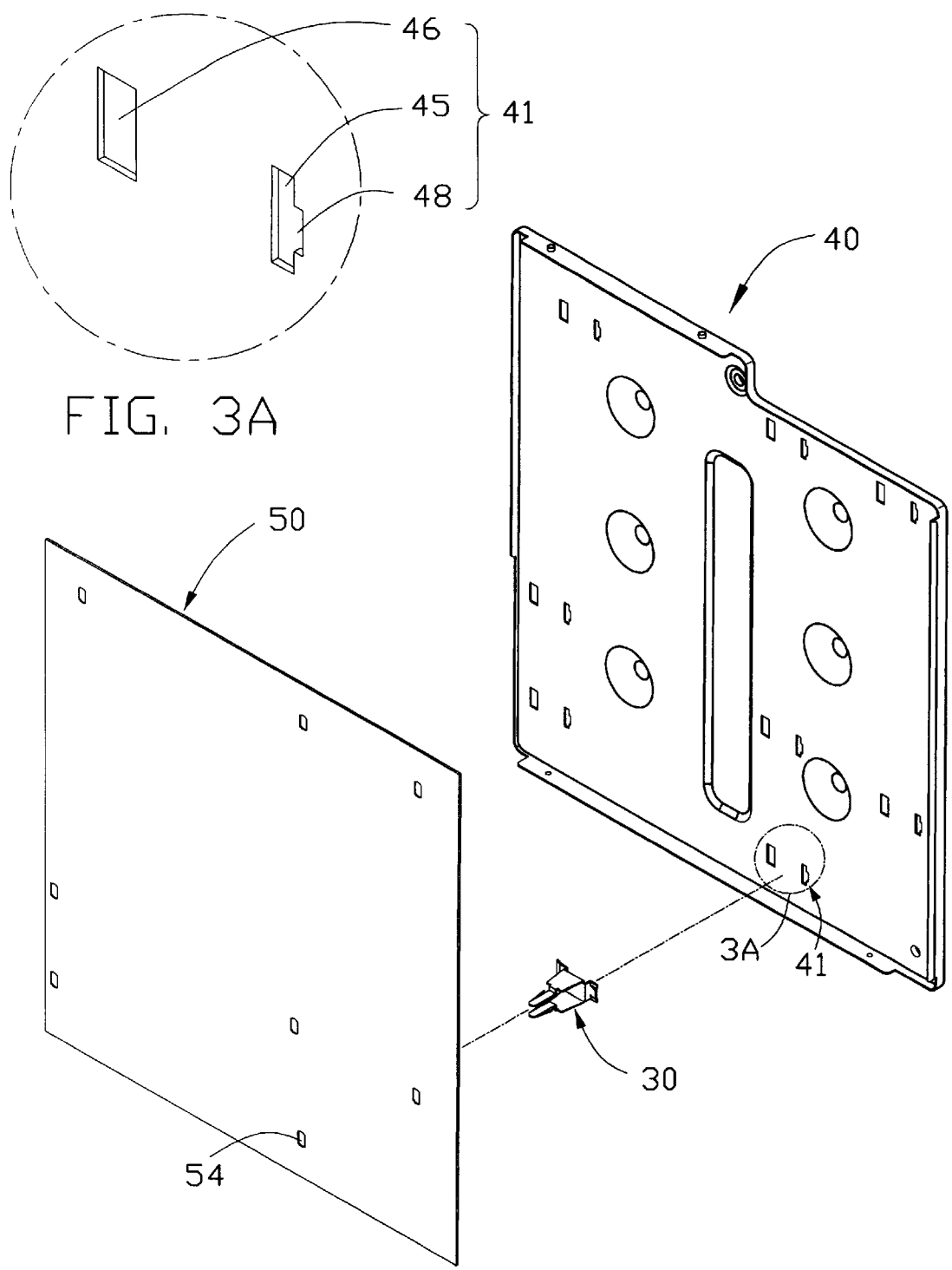
FIG. 3 is a perspective view illustrating the spatial relationship between the circuit board retainer of the present invention and a circuit board and a support panel.
FIG. 3A is an enlarged view of encircled portion 3A of FIG. 3.

Referring to the drawings and in particular to FIG. 3, a circuit board retainer constructed in accordance with the present invention, generally designated with reference numeral 30, is adapted to retain a circuit board 50 on a support panel 40. Also referring to FIGS. 1 and 2, the circuit board retainer 30 comprises a U-shaped body 11 with board connecting means 13 and panel connecting means 15 respectively formed on top and bottom sides thereof for connection with the circuit board 50 and the support panel 40.

The body 11 comprises a base plate 16 and two spaced side plates 17 extending from the base plate 16. The board connecting means 13 comprises a resilient L-shaped member 20 having a first section 19 extending from each side plate 17 in a direction substantially normal thereto and a second section 21 extending from the first section 19 in a direction substantially parallel to the side plate 17. The second sections 21 of the L-shaped members of the board connecting means 13 are spaced from each other a distance smaller than that between the side plates 17. The space between the second sections 21 allows the second sections 21 to be resiliently deformable toward each other. Wedge-shaped barbs 23 are formed on opposite edges of each second section 21 of the board connecting means 13. The barbs 23 of the two L-shaped members 20 are made inclined with respect to the corresponding second sections 21 and extending in opposite directions.

The panel connecting means 15 comprise first and second retaining tabs 25, 26 extending from opposite edges of the base plate 16 in opposite directions. The retaining tabs 25, 26 are offset from the base plate 16 at substantially the same distance thereby forming an L-shaped configuration and being located at a plane substantially parallel to and spaced from a plane of the base plate 16. The first retaining tab 25 is divided into a central section 28 located between two side sections 27. The central section 28 is made inclined upward with respect to the side sections 27. The second retaining tab 26 forms a downward inclined free edge section 29.

Referring back to FIG. 3, to be connected to the circuit board retainer 30, the circuit board 50 defines a slot 54 for receiving the L-shaped members 20 of the board connecting means 13 and engaging with the barbs 23 thereof. The support panel 40 forms engaging means 41 comprising a pair of rectangular openings 45, 46 (FIG. 3A) defined in the support panel 40 for receiving the retaining tabs 25, 26 of the panel connecting means 15. A notch 48 is defined in an edge of the opening 45.

Figure 4:
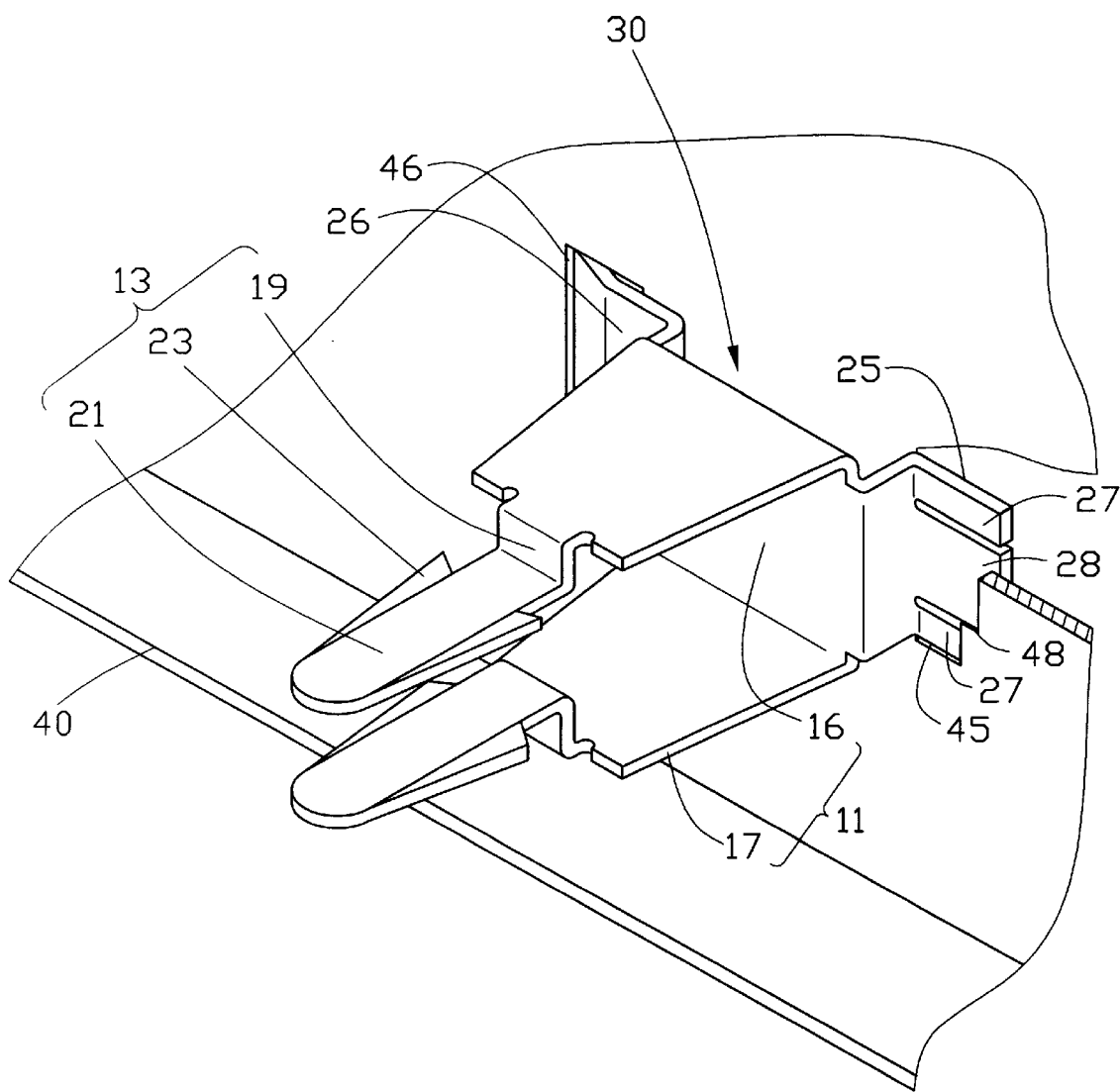
FIG. 4 shows an initial phase when the circuit board retainer is mounted to the support panel.
Figure 5:
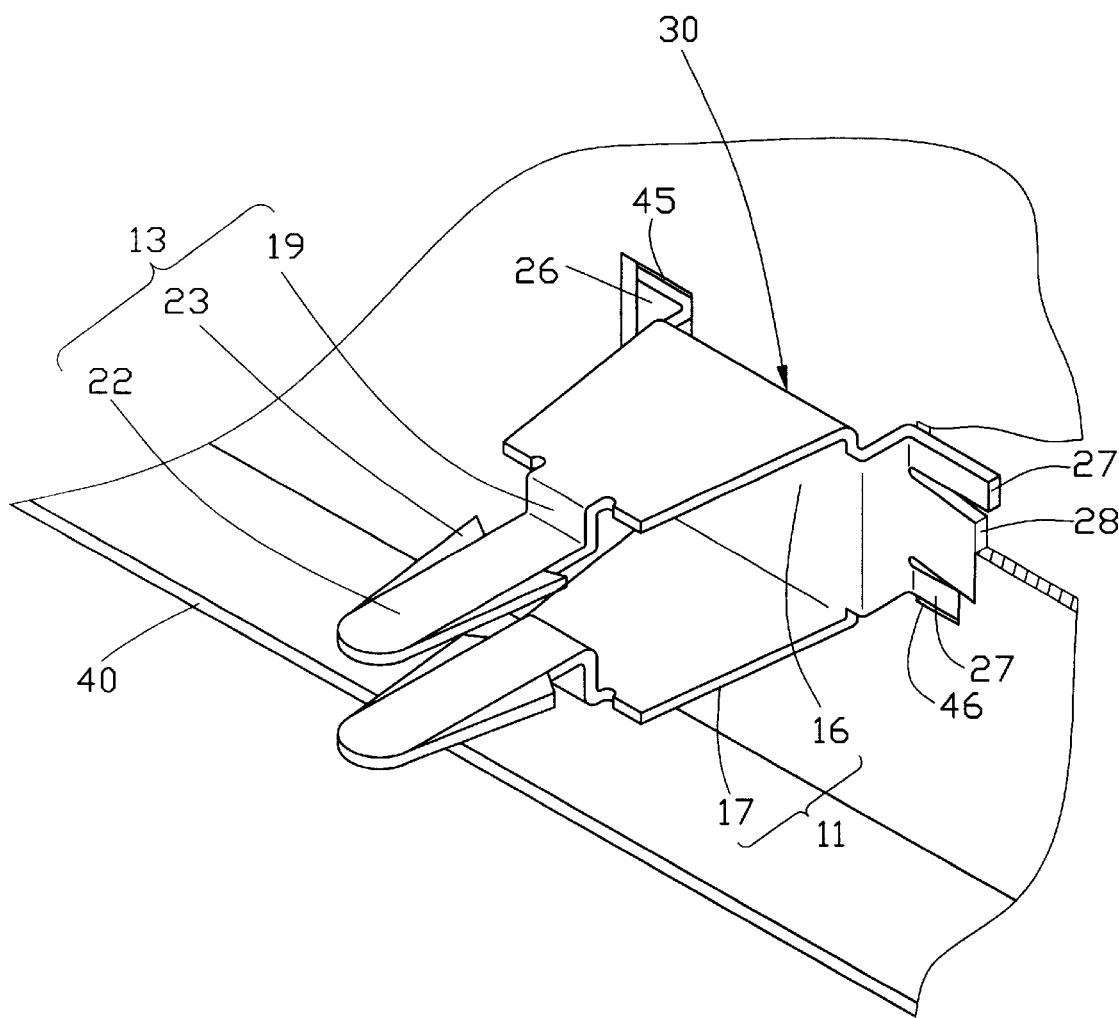
FIG. 5 shows a final phase when the circuit board retainer is mounted to the support panel.

Referring to FIGS. 4 and 5, to mount the circuit board retainer 30 to the support panel 40, the first retaining tab 25 is inserted into the corresponding opening 45 in an inclined direction. Then the second retaining tab 26 is forced toward the opening 46 by moving the circuit board retainer 30 with respect to the support panel 40. The second retaining tab 26 is forcibly inserted into the corresponding opening 46 with the aid of the inclined edge section 29 thereof. The circuit board retainer 30 is further moved to have a free edge of the central section 28 of the retaining tab 25 abuttingly engaging the notch 48 while the side sections 27 overlappingly engage an underside of the support panel 40 as shown in FIG. 5 whereby the circuit board retainer 30 is securely fixed to the support panel 40.

Figure 6:
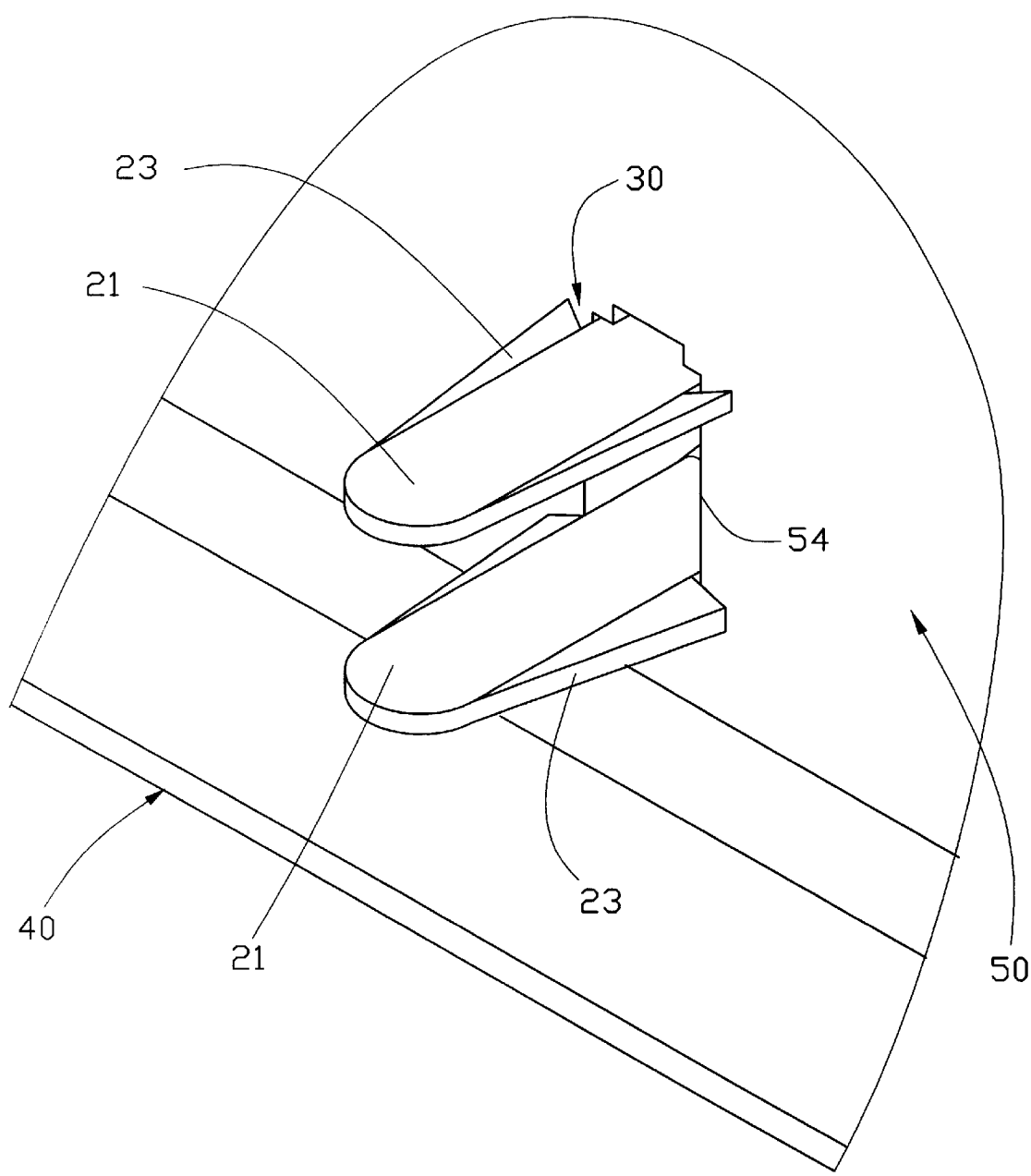
FIG. 6 shows the circuit board retainer engaging with the circuit board.
Figure 7:
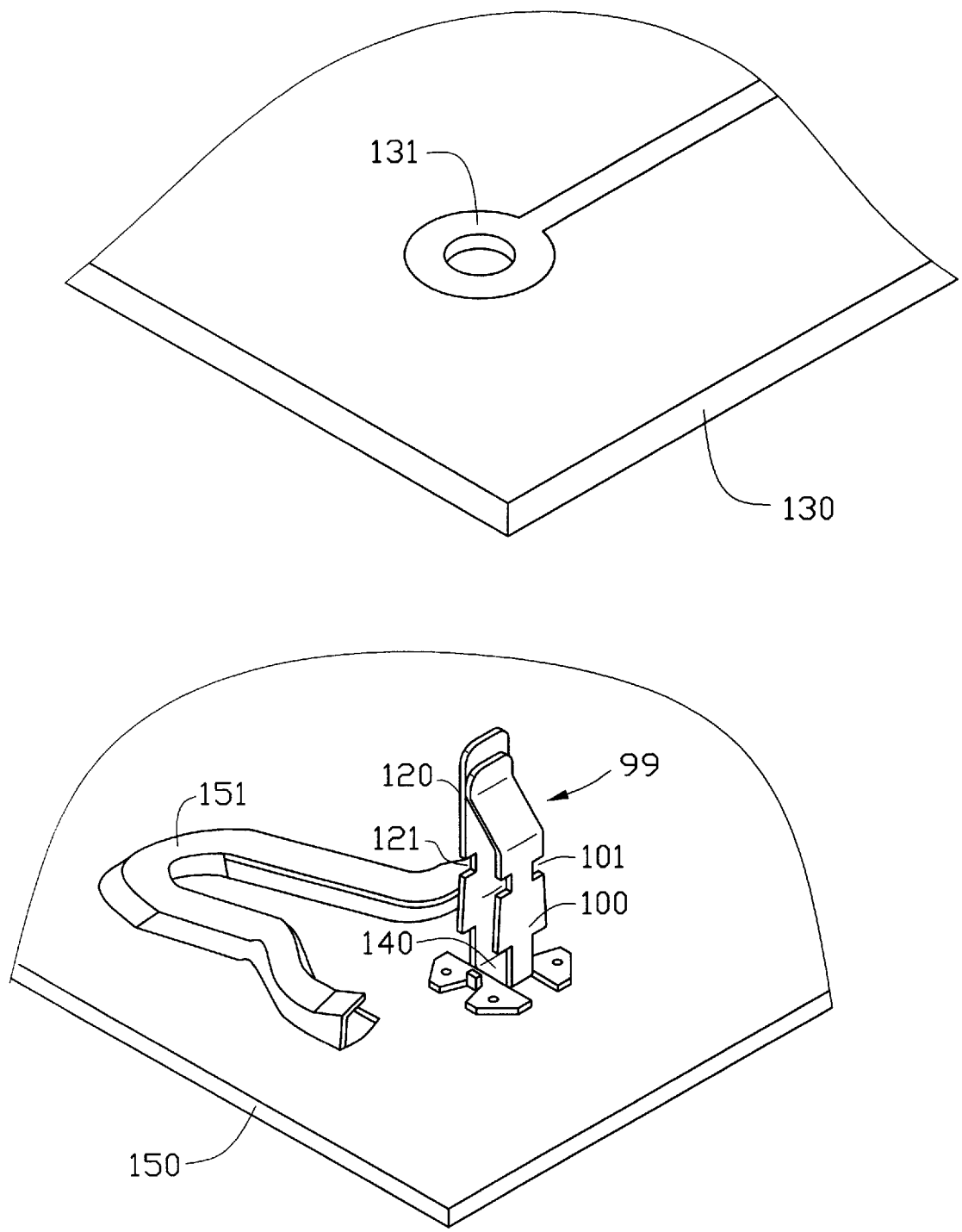
FIG. 7 is a perspective view of a conventional circuit board retainer for retaining a circuit board on a support panel.

Referring to FIG. 6, to mount the circuit board 50 to the circuit board retainer 30, the L-shaped members 20 are forcibly inserted into the slot 54 of the circuit board 50 whereby the barbs 23 and the second sections 21 are elastically deformed to allow the second sections 21 to substantially extend beyond the slot 54 to such an extend that the barbs 23 engage with edges of the slot 54. Preferably, the second sections 21 have rounded free ends for facilitating insertion of the L-shaped members 20 into the slot 54. The first sections 19 of the L-shaped members 20 form shoulders for supporting the circuit board 50 whereby the circuit board 50 is interposed between the first sections 19 and the barbs 23 and thus securely retaining the circuit board 50 on the circuit board retainer 30.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A retainer for retaining a circuit board on a support panel comprising:

a body having first and second ends, the second end forming a first plane;

board connecting means formed on the first end of the body for engaging with the circuit board, the board connecting means comprising two spaced resilient members extending from the first end of the body for being inserted into a slot defined in the circuit board by being resiliently deformed, wedge-shaped barbs being formed on opposite edges of each resilient member adapted to engage with an edge of the slot for retaining the circuit board on the retainer; and panel connecting means formed on the second end of the body for engaging with the support panel thereby supporting the circuit board on the support panel, the panel connecting means comprising first and second retaining tabs extending from the second end of the body in opposite directions and located at a second plane substantially parallel to and spaced from the first plane for being respectively received in first and second openings defined in the support panel, the first retaining tab comprising a central section located between and separate from two side sections, the central section being inclined upward with respect to the side sections, whereby when the retaining tabs are received in the openings of the support panel, the central section of the first retaining tab abuts against a notch defined in an edge of the first opening while the side sections of the first retaining tab and the second retaining tab overlappingly engage an underside of the support panel for securing the retainer on the support panel.

2. The retainer as claimed in claim 1, wherein the second retaining tab forms a downward inclined free edge section for guiding the second retaining tab into the second opening of the support panel after the first retaining tab is inserted into the first opening of the support panel.

3. The retainer as claimed in claim 1, wherein the resilient members of the board connecting means are L-shaped comprising a first section extending from the body and a second section extending from the first section in a direction substantially normal thereto, the barbs being formed on opposite edges of the second section of each L-shaped resilient member, the first section forming a shoulder for supporting the circuit board whereby the circuit board is interposed between the barbs and the first sections.

4. The retainer as claimed in claim 1, wherein the body is U-shaped comprising a base plate forming the first plane and two spaced side plates extending from the base plate, the retaining tabs of the panel connecting means are L-shaped extending from opposite edges the base plate in opposite directions substantially parallel therewith, the resilient members of the board connecting means respectively extending from the side plates.

5. The retainer as claimed in claim 1, wherein the barbs are inclined with respect to the resilient members.

6. A circuit board assembly comprising:

a support panel defining a pair of openings;

a circuit board defining a slot therein; and a plurality of retainers connecting the circuit board to the support panel, each retainer comprising:

a body having first and second ends, the second end forming a first plane;

board connecting means formed on the first end of the body for engaging with the circuit board, the board connecting means comprising two spaced resilient members extending from the first end of the body for being inserted into the slot defined in the circuit board by being resiliently deformed, wedge-shaped barbs being formed on opposite edges of each resilient member adapted to engage with an edge of the slot for retaining the circuit board on the retainer; and panel connecting means formed on the second end of the body for engaging with the support panel thereby supporting the circuit board on the support panel, the panel connecting means comprising first and second retaining tabs extending from the second end of the body in opposite directions and located at a second plane substantially parallel to and spaced from the first plane for being respectively received in the first and second openings of the support panel, the first retaining tab comprising a central section located between and separate from two side sections, the central section being inclined upward with respect to the side sections, whereby when the retaining tabs are received in the openings of the support panel, the central section of the first retaining tab abuts against an edge of the first opening while the side sections of the first retaining tab and the second retaining tab overlappingly engage an underside of the support panel for securing the retainer on the support panel.

7. The circuit board assembly as claimed in claim 6, wherein the second retaining tab forms a downward inclined free edge section for guiding the second retaining tab into the second opening of the support panel after the first retaining tab is inserted into the first opening of the support panel.

8. The circuit board assembly as claimed in claim 6, wherein the resilient members of the board connecting means are L-shaped comprising a first section extending from the body and a second section extending from the first section in a direction substantially normal thereto, the barbs being formed on opposite edges of the second section of each L-shaped resilient member, the first section forming a shoulder for supporting the circuit board whereby the circuit board is interposed between the barbs and the first sections.

9. The circuit board assembly as claimed in claim 6, wherein the body is U-shaped comprising a base plate forming the first plane and two spaced side plates extending from the base plate, the retaining tabs of the panel connecting means are L-shaped extending from opposite edges the base plate in opposite directions substantially parallel therewith, the resilient members of the board connecting means respectively extending from the side plates.

10. The circuit board assembly as claimed in claim 6, wherein the barbs are inclined with respect to the resilient members.

11. A circuit board assembly comprising:
a support panel defining a pair of openings;
a retainer positioned on the support panel and including:
a body defining opposite first and second ends; board connecting means formed on the first end and defining a horizontal section to cooperate with wedge-shaped barbs for retainably sandwiching a circuit board therebetween;
panel connecting means formed on the second end for retainable engagement with the support panel thereby supporting the circuit board on the support panel, said panel connection means including first and second opposite retaining tabs extending from the second end of the body and through the corresponding openings of the support panel, respectively, at least one of said retaining tabs defining two sections split from each other; wherein
one of said two sections abuts against one edge of the corresponding opening while the other of said two sections overlappingly engages an underside of the support panel for securing the retainer on the support panel.

12. The assembly as claimed in claim 11, wherein the section engaging the underside of the support panel horizontally extends parallel to the support panel while the section abutting against the edge of the opening obliquely extends upward.

* * * * *